US012604666B2

(12) United States Patent
Miyazaki et al.

(10) Patent No.: US 12,604,666 B2
(45) Date of Patent: Apr. 14, 2026

(54) LAMINATED PIEZOELECTRIC ELEMENT

(71) Applicant: TDK CORPORATION, Tokyo (JP)

(72) Inventors: Satoshi Miyazaki, Tokyo (JP); Yasuyuki Satoh, Tokyo (JP); Keiji Oguchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1079 days.

(21) Appl. No.: 17/625,558

(22) PCT Filed: Oct. 7, 2020

(86) PCT No.: PCT/JP2020/038007
§ 371 (c)(1),
(2) Date: Jan. 7, 2022

(87) PCT Pub. No.: WO2021/070868
PCT Pub. Date: Apr. 15, 2021

(65) Prior Publication Data
US 2022/0278266 A1 Sep. 1, 2022

(30) Foreign Application Priority Data
Oct. 11, 2019 (JP) ................................. 2019-187925

(51) Int. Cl.
*H01L 41/04* (2006.01)
*H10N 30/50* (2023.01)
(Continued)

(52) U.S. Cl.
CPC ........... *H10N 30/802* (2023.02); *H10N 30/50* (2023.02); *H10N 30/871* (2023.02); *H10N 30/872* (2023.02); *H10N 30/875* (2023.02)

(58) Field of Classification Search
CPC .... H10N 30/50; H10N 30/871; H10N 30/872; H10N 30/875
See application file for complete search history.

(56) References Cited

U.S. PATENT DOCUMENTS

2004/0255443 A1* 12/2004 Iwase ................... H10N 30/053
29/25.35
2007/0124903 A1* 6/2007 Iwase ................... H10N 30/053
29/25.35
(Continued)

FOREIGN PATENT DOCUMENTS

CN 104465090 A 3/2015
JP 2012-004467 A 1/2012
(Continued)

OTHER PUBLICATIONS

English Translation of JP 2012004467 (Year: 2012).*
(Continued)

*Primary Examiner* — Bryan P Gordon
(74) *Attorney, Agent, or Firm* — Oliff PLC

(57) ABSTRACT

A laminated piezoelectric element has excellent suppression effect on characteristics deterioration caused by a pyroelectric effect. Inside an element main body are a first internal electrode, a piezoelectric layer, and a second internal electrode that has different polarity from the first internal electrode, which are repeatedly layered a plurality of times along the lamination direction. A first external electrode is formed on a first side surface of the element main body. A second external electrode is formed on a second side surface of the element main body. A resistance layer connected to the internal electrodes is formed in at least part of a third side surface of the element main body in which the internal electrodes are exposed. An insulating layer is formed on a third side of the element main body so as to cover the resistance layer.

11 Claims, 14 Drawing Sheets

(51) Int. Cl.
    *H10N 30/80*      (2023.01)
    *H10N 30/87*      (2023.01)

(56)            References Cited

U.S. PATENT DOCUMENTS

| | | | |
|---|---|---|---|
| 2007/0236108 A1 | 10/2007 | Nishimura | |
| 2013/0193810 A1* | 8/2013 | Ozawa | H10N 30/50 |
| | | | 310/366 |
| 2013/0342082 A1* | 12/2013 | Itoh | H10N 30/508 |
| | | | 310/366 |
| 2015/0084487 A1* | 3/2015 | Mori | H01G 4/248 |
| | | | 336/200 |
| 2018/0040397 A1* | 2/2018 | Mori | H01C 7/008 |
| 2019/0131072 A1* | 5/2019 | Onodera | H01G 4/012 |

FOREIGN PATENT DOCUMENTS

| | | |
|---|---|---|
| JP | 5040649 B2 | 10/2012 |
| JP | 2013-157406 A | 8/2013 |
| JP | 2013-211432 A | 10/2013 |
| JP | 5842635 B2 | 1/2016 |
| WO | 2007/052599 A1 | 5/2007 |
| WO | 2012/173081 A1 | 12/2012 |

OTHER PUBLICATIONS

Apr. 12, 2022 International Preliminary Report on Patentability issued in International Patent Application No. PCT/JP2020/038007.
Dec. 15, 2020 International Search Report issued in International Patent Application No. PCT/JP2020/038007.

* cited by examiner

LAMINATED PIEZOELECTRIC ELEMENT

TECHNICAL FIELD

The present invention relates to a laminated piezoelectric element.

BACKGROUND

The piezoelectric element is an element that mutually converts mechanical displacement and electrical displacement by utilizing the piezoelectric effect and the inverse piezoelectric effect. Piezoelectric elements are used in various products, for example, as actuators for applications requiring precise and accurate control. Specific examples thereof include applications for driving a lens, driving an HDD head, driving an inkjet printer head, and driving a fuel injection valve.

When a laminated piezoelectric element is formed by laminating piezoelectric elements so as to increase the resulting displacement, the ends of the internal electrodes sandwiching the piezoelectric layers may be exposed on the surface of the element body. In this case, migration may be generated between the internal electrodes having different polarities due to moisture in the air or the like.

When such a piezoelectric element is used in, for example, portable electronic devices, it is exposed to temperature change due to change in the surrounding environment.

When exposed to such temperature change, polarization due to the pyroelectric effect becomes a problem. In particular, in the process of lowering the temperature, the piezoelectric element is polarized in the direction opposite to the electric polarization due to the pyroelectric effect, and the degree of polarization is lowered. This lowered degree of polarization does not recover even if the temperature rises again. Thus, if the process of lowering the temperature is repeated, the degree of polarization gradually decreases, the desired displacement cannot be obtained, and there is a problem that the characteristics deteriorate.

To deal with such a problem, Patent Document 1 discloses a piezoelectric element in which internal electrodes exposed on the side surface of the laminated piezoelectric body are covered with an exterior member for preventing migration, and conductive particles are further dispersed in the exterior material.

Patent Document 1 also discloses that this piezoelectric element can prevent migration by the exterior material for preventing migration and also prevent a decrease in the degree of polarization due to the pyroelectric effect.

To determine the resistance value of the exterior material within the range in which migration and the decrease in the degree of polarization can be prevented, however, it is necessary to consider the fluctuation of the resistance value of the resin constituting the exterior material, the amount of conductive particles, and the like, and there is a problem with difficulty for adjustment of the resistance value.

To overcome such a problem, the present applicant develops a laminated piezoelectric element shown in Patent Document 2. In the laminated piezoelectric element shown in Patent Document 2, however, it is found that the resistance value of the resistance layer may fluctuate due to exposure of the resistance layer to the outside air if no treatment is performed. It is also found that, in the laminated piezoelectric element shown in Patent Document 2, the resistance value tends to be high because the resistance layer connecting the pair of external electrodes tends to be thin at the corners of the element body. If the resistance of the resistance layer partially becomes too high, there is a problem that it tends to be insufficient to prevent the deterioration of the degree of polarization due to the pyroelectric effect.

PRIOR ARTS

Patent Document

Patent Document 1: JP5040649 (B2)
Patent Document 2: JP5842635 (B2)

SUMMARY OF INVENTION

Problems to be Solved by Invention

The present invention has been achieved under such circumstances. It is an object of the invention to provide a laminated piezoelectric element excellent in prevention effect on characteristic deterioration due to pyroelectric effect.

Means for Solving the Problem

To solve the above object, a laminated piezoelectric element according to the present invention comprises:

an element body including a first internal electrode, a piezoelectric layer, and a second internal electrode having a polarity different from that of the first internal electrode laminated in this order along a lamination direction;

a first external electrode electrically connected to the first internal electrode and formed on a first side surface of the element body;

a second external electrode electrically connected to the second internal electrode and formed on a second side surface of the element body;

a resistance layer formed on at least a part of a third side surface of the element body where the first internal electrode and the second internal electrode are exposed so as to connect the first internal electrode and the second internal electrode; and an insulating layer formed on the third side surface so as to cover the resistance layer.

In the laminated piezoelectric element of the present invention, the resistance layer connects the first internal electrode and the second internal electrode having different polarities and exposed on the third side surface of the element body. The resistance layer has an electrical resistance value higher than that of the internal electrode and lower than that of the insulating layer. Thus, even if the temperature environment of the laminated piezoelectric element changes to cause polarization in the direction opposite to the direction of electric polarization, the generated charge can be discharged reliably via the resistance layer. As a result, the laminated piezoelectric element according to the present invention can prevent a decrease in the degree of polarization even when placed in an environment where the temperature changes.

In the laminated piezoelectric element of the present invention, since the resistance layer is covered with the insulating layer, the resistance layer is not exposed to the outside air, and the electric resistance value of the resistance layer is hard to change. Thus, the laminated piezoelectric element of the present invention is excellent in the prevention effect on characteristic deterioration due to the pyroelectric effect. The insulating layer prevents migration, and the resistance layer prevents a decrease in the degree of polarization, so that it is possible to obtain a highly reliable laminated piezoelectric element.

The resistance layer may be formed on the third side surface of the element body so as to cover the entire surface thereof. A resistor non-covered part where the first internal electrode or the second internal electrode is exposed without forming the resistance layer may remain on the third side surface of the element body. In that case, the insulating layer covers the resistance layer and also covers the resistor non-covered part. In any case, the first internal electrode and the second internal electrode having different polarities and exposed on the third side surface of the element body are entirely covered with the resistance layer or are entirely covered with the insulating layer together with the resistance layer. Thus, it is possible to prevent the ingress of moisture from the outside and securely prevent the migration generated between the internal electrodes having different polarities.

When the third side surface of the element body includes the resistor non-covered part, the resistance layer does not cover the entire surface of the third side surface, so that the load on the piezoelectric element is small to be able to sufficiently exhibit the piezoelectric characteristics. In addition, when the resistor non-covered part is provided on the third side surface of the element body, the covering area of the resistor layer can be reduced, and this contributes to cost reduction.

The resistance layer may include a vertically continuous part formed continuously along the lamination direction on the third side surface of the element body. Preferably, the vertically continuous part is located near the center of the third side surface in its width direction. In this configuration, the resistance layer does not need to pass through the corners of the element body and is easily formed with uniform thickness. As a result, the resistance value of the resistance layer tends to be stable, and it is possible to effectively prevent a decrease in the degree of polarization due to the pyroelectric effect. Since the resistance layer does not cover the entire surface of the third side surface of the element body, the load on the piezoelectric element is small to be able to sufficiently exhibit the piezoelectric characteristics.

The resistance layer may include an island part formed intermittently along the lamination direction on the third side surface of the element body. When the resistance layer is formed intermittently, the load on the piezoelectric element is small to be able to sufficiently exhibit the piezoelectric characteristics.

The resistance layer may include an extension part covering a surface of the first external electrode or the second external electrode. In the laminated piezoelectric element of the present invention, the resistance layer connects the internal electrodes and does not thereby need to connect the external electrodes, but the extension part covering the surface of the first external electrode or the second external electrode may be formed at the time of forming the resistance layer 20. At the corners of the element body, the resistance layer may have a thin part, but it is not necessary to connect the external electrodes, and the function of the resistance layer is thereby unlikely to deteriorate.

The insulating layer may be formed on the element body so as to also cover the extension part. In that case, the extension part of the resistance layer can also be protected.

A first lead wire may be connected to the first external electrode, a second lead wire may be connected to the second external electrode, and the first lead wire and the second lead wire are preferably pulled out in a direction away from the third side surface.

When the lead wires are pulled out in a direction away from the third side surface, the lead wires are less likely to contact with the resistance layer, and it is possible to reduce short circuit failures or so.

DETAILED DESCRIPTION OF INVENTION

Hereinafter, the present invention is described based on the embodiments shown in the figures.

First Embodiment

Figure 1:
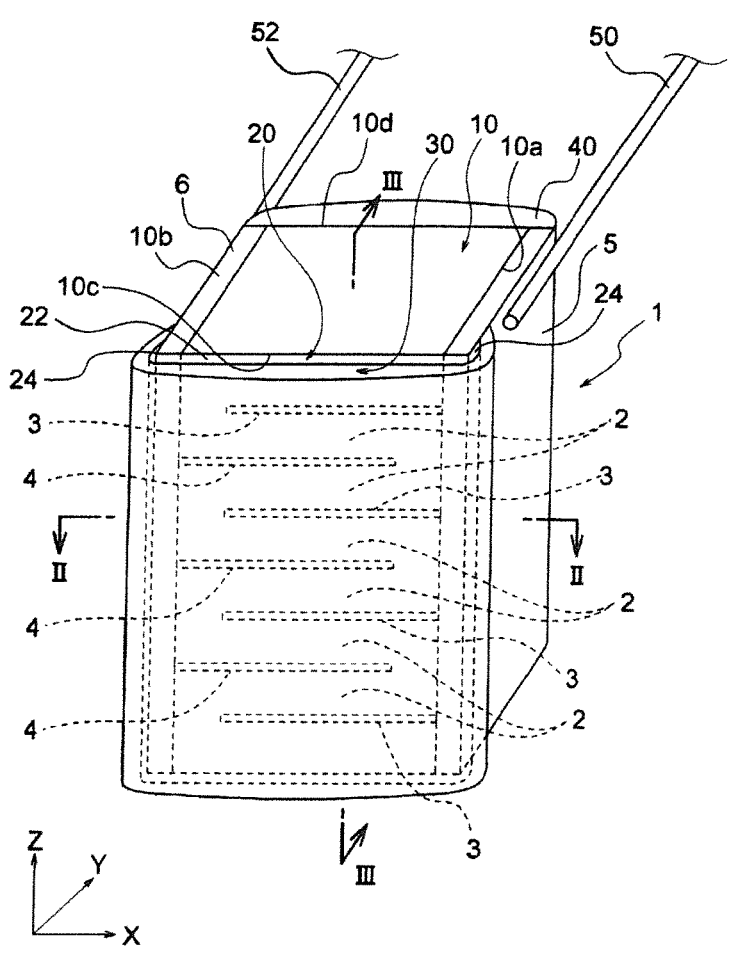
FIG. 1 is a schematic perspective view illustrating a laminated piezoelectric element according to an embodiment of the present invention.

As shown in FIG. 1, a laminated piezoelectric element 1 according to the present embodiment includes a quadrangular prism-shaped element body 10. Inside the element body 10, first internal electrodes 3, piezoelectric layers 2, and second internal electrodes 4 having a polarity different from that of the first internal electrodes 3 are laminated repeatedly multiple times in the Z-axis direction (lamination direction). In the figures, the X-axis, the Y-axis, and the Z-axis are orthogonal to each other, and the Z-axis coincides with the lamination direction.

Figure 2A:
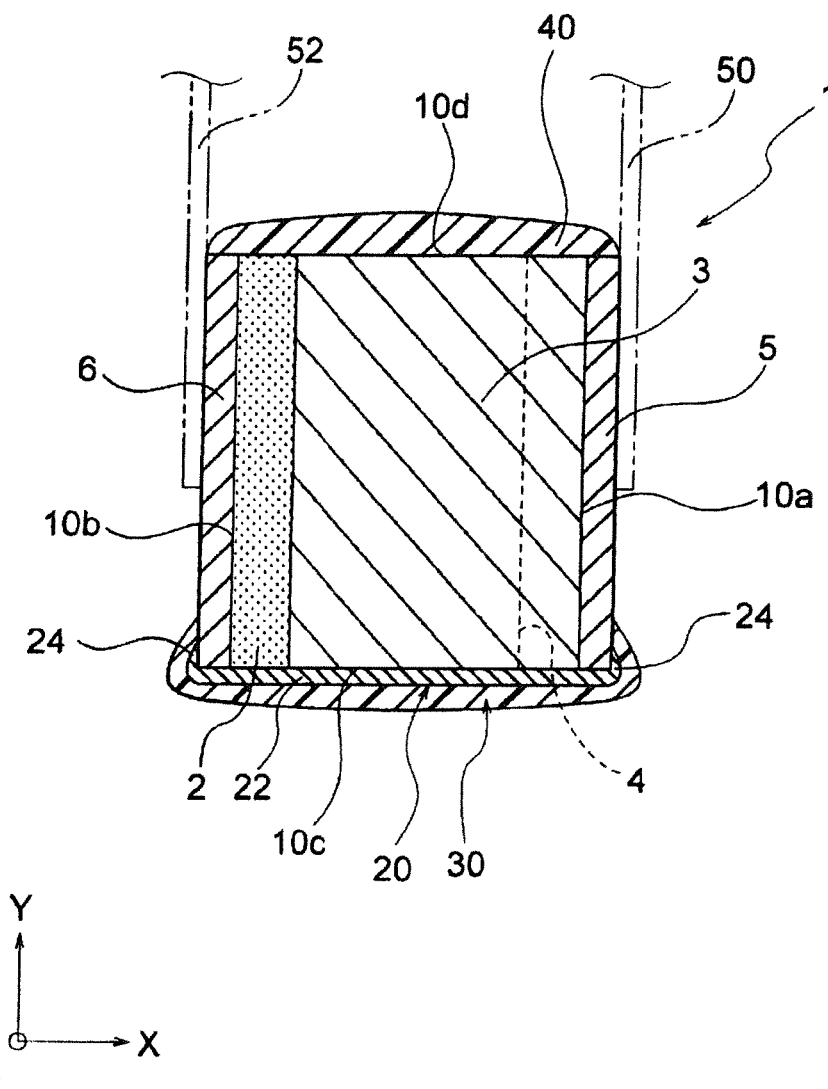
FIG. 2A is a cross-sectional view of a main part of the laminated piezoelectric element along the line II-II shown in FIG. 1.

As shown in FIG. 2A, the front ends of the first internal electrodes 3 in the X-axis direction are exposed on a first side surface 10a of the element body 10, and a first external electrode 5 is formed so as to electrically be connected with the first internal electrodes 3. The front ends of the second internal electrodes 4 in the X-axis direction are exposed on a second side surface 10b of the element body 10, and a second external electrode 6 is formed so as to electrically be connected with the second internal electrodes 4.

The back ends of the first internal electrodes 3 in the X-axis direction are not exposed to the second side surface 10b of the element body 10 and are electrically insulated from the second external electrode 6. Likewise, the back ends of the second internal electrodes 4 in the X-axis direction are not exposed to the first side surface 10a of the element body 10 and are electrically insulated from the first external electrode 5.

Figure 3:
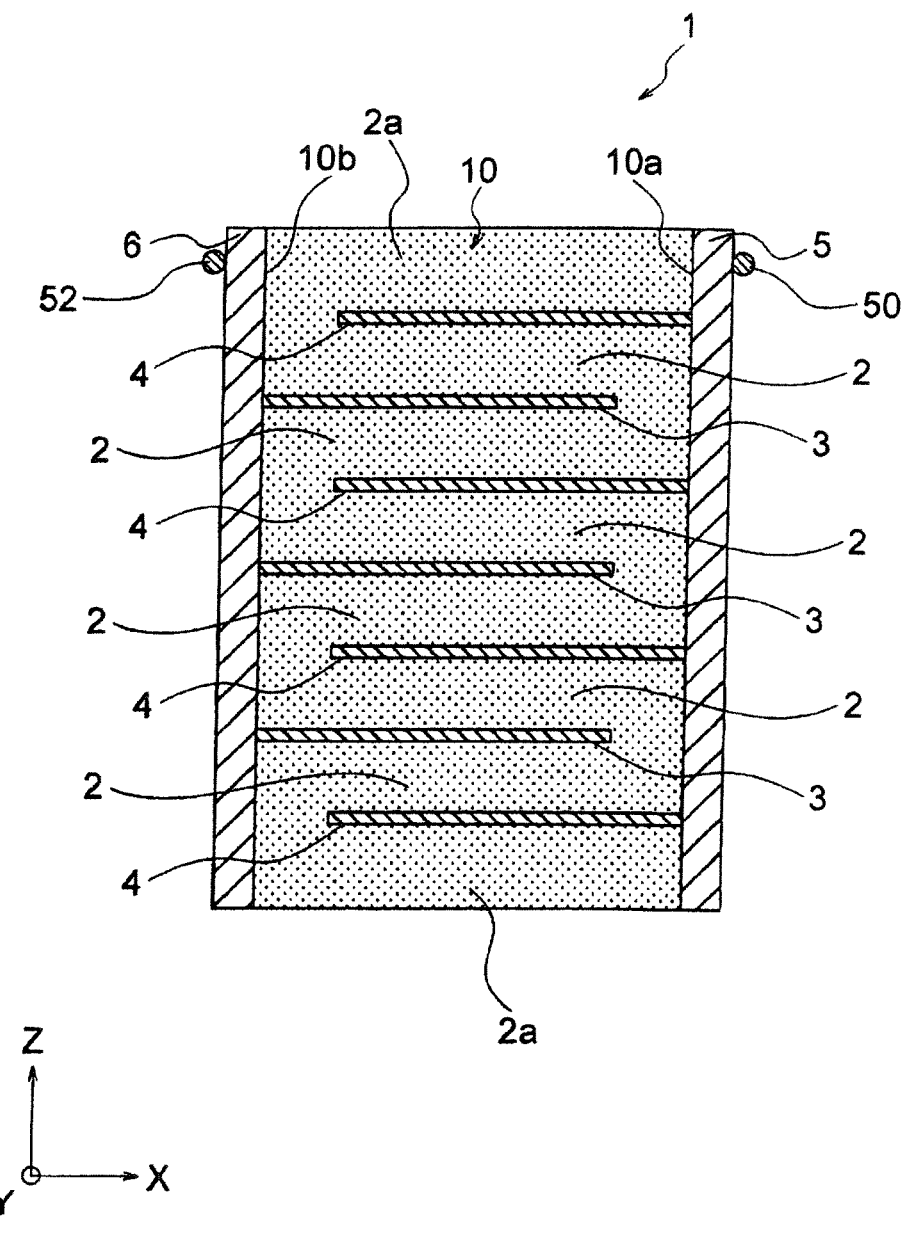
FIG. 3 is a cross-sectional view of a main part of the laminated piezoelectric element along the line shown in FIG. 1.

As shown in FIG. 3, the part of the piezoelectric layers 2 in which the first internal electrodes 3 and the second internal electrodes 4 overlap with each other when viewed from the Z-axis direction (lamination direction) is a part where a mechanical displacement is generated at the time of applying voltage to the external electrodes 5 and 6 of the piezoelectric element 1 (piezoelectrically active part). The other part is a part where no mechanical displacement is generated even at the time of applying voltage to the external electrodes 5 and 6 of the piezoelectric element 1 (piezoelectrically inactive part). Distal regions 2a of the piezoelectric layers 2 corresponding to both ends of the element body 10 in the Z-axis direction, which are not sandwiched between the first internal electrodes 3 and the second internal electrodes 4, are also the piezoelectrically inactive part. The piezoelectrically active part corresponds to a part of the piezoelectric layers 2 sandwiched between the first internal electrodes 3 and the second internal electrodes 4.

The material of the piezoelectric layers 2 is not limited as long as it exhibits a piezoelectric effect or an inverse piezoelectric effect and is, for example, $PbZrxTi_{1-x}O_3$, $BaTiO_3$, $PbTiO_3$, $KNbO_3$, $LiNbO_3$, $LiTaO_3$, $NaWO_3$, $BiFeO_3$, or $(KxNa_{1-x})NbO_3$. In addition, a component for improving the characteristics may be contained, and the amount thereof may be determined appropriately based on the desired characteristics. The thickness of each of the piezoelectric layers 2 is not limited, but is preferably about 5-50 µm in the present embodiment.

The conductive material of each of the internal electrode layers 3 and 4 is not limited, but is, for example, noble metals, such as Ag, Pd, Au, and Pt, alloy thereof (e.g., Ag—Pd), base metals, such as Cu and Ni, or alloy thereof. Preferably, the thickness of each of the internal electrode layers 3 and 4 is 1-5 µm.

The material of the external electrodes 5 and 6 is not limited either, and a material similar to the conductive material constituting the internal electrodes can be used. Moreover, a plating layer or a sputter layer of the above-mentioned various metals may be formed on the outside.

As shown in FIG. 1 and FIG. 2A, one ends of the internal electrodes 3 and 4 in the Y-axis direction are exposed to the third side surface 10c of the element body 10, and the exposed ends of the internal electrodes 3 and 4 in the Y-axis direction are covered with a resistance layer 20. That is, the internal electrode layers 3 and 4 are connected to each other via the resistance layer 20 on the third side surface 10c of the element body 10.

The resistance layer 20 includes a vertically continuous part 22 formed continuously in the Z-axis direction on the third side surface 10c of the element body 10 and also includes extension parts 24 covering the surfaces of the first external electrode 5 and the second external electrode 6 on one end side in the Y-axis direction. In the present embodiment, the vertically continuous part 22 of the resistance layer 20 covers the entire surface of the third side surface 10c of the element body 10.

Figure 2B:
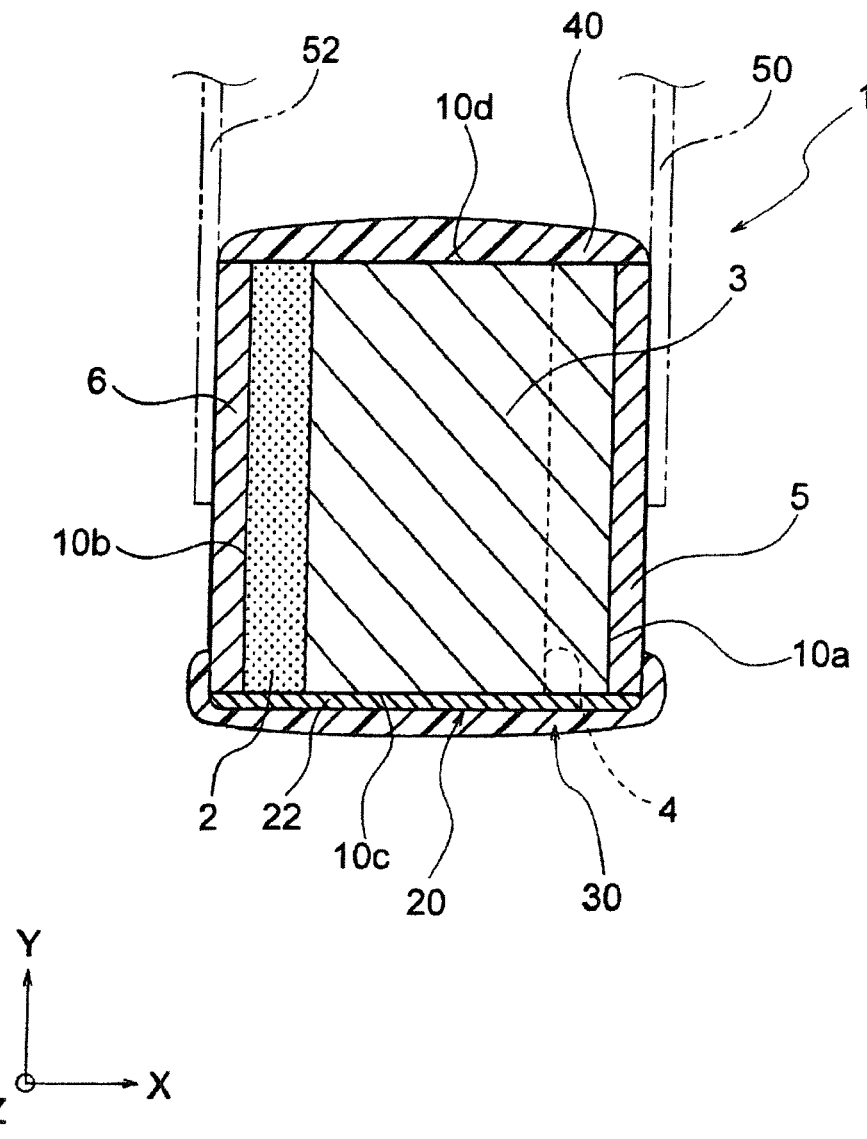
FIG. 2B is a cross-sectional view of a main part of the laminated piezoelectric element according to a modified example of FIG. 2A.

The extension parts 24 are formed continuously to the vertically continuous part 22 and continuously cover the corner between the first side surface 10a and the third side surface 10c of the element body 10 and the corner between the second side surface 10b and the third side surface 10c of the element body 10 in the Z-axis direction. As shown in FIG. 2B, the resistance layer 20 may consist of only the vertically continuous part 22, and at least one of a pair of extension parts 24 shown in FIG. 2A is not necessarily formed on the resistance layer 20.

In FIG. 1, the extension parts 24 are not formed at both ends of the resistance layer 20 in the Z-axis direction, but the extension parts 24 may also be formed at least at either end of the resistance layer 20 in the Z-axis direction.

In the present embodiment, an insulating layer 30 is formed so as to cover the entire surface of the resistance layer 20. That is, the insulating layer 30 is formed from the third side surface 10c to a part of the first side surface 10a of the element body 10 and from the third side surface 10c to a part of the second side surface 10b so as to cover not only the vertically continuous part 22 but also the extension parts 24 of the resistance layer 20. In FIG. 1, it seems that both ends of the resistance layer 20 in the Z-axis direction are not covered with the insulating layer 30, but both ends of the resistance layer 20 in the Z-axis direction are preferably also covered with the insulating layer 30.

In the present embodiment, since the resistance layer 20 is formed, as shown below, the pyroelectric effect enables the discharge of the electric charge generated by the polarization in the direction opposite to the electric polarization direction.

Normally, in the manufacturing process of the piezoelectric element 1, the piezoelectric element 1 is polarized so as to expand and contract when voltage is applied, and the direction of electric polarization is determined. When the piezoelectric element 1 is placed in an environment where the temperature changes, polarization is generated in the direction opposite to the electric polarization direction due to the pyroelectric effect, especially when the temperature decreases. The electric charge generated by this polarization acts so as to cancel the electric charge generated by the electric polarization, so that the degree of polarization due to the electric polarization decreases.

In order to prevent such a decrease in the degree of polarization, in the present embodiment, the resistance layer 20 mainly formed on the third side surface 10c connects the first internal electrodes 3 and the second internal electrode 4 exposed on the third side surface 10c. As a result, the electric charge generated by the pyroelectric effect can be discharged.

The material of the resistance layer 20 is not limited as long as it has a specific resistance higher than that of the internal electrode layers 3 and 4 and lower than that of the insulating layer and can discharge the electric charge generated by the pyroelectric effect. Specific examples of the material of the resistance layer 20 include a resin having a predetermined specific resistance, an insulating resin containing conductive particles such as carbon, and a metal oxide. The resistance layer 20 may be formed by winding a film having a predetermined specific resistance around the side surfaces of the element body. The resistance layer 20 may be formed of a sputter film or the like. The resistance layer 20 may be formed by containing conductive particles or the like in the insulating resin or the like used in the insulating layer 30 so as to lower the specific resistance.

Preferably, the resistance layer 20 is made of a phenol resin in which conductive particles such as carbon particles are dispersed. The phenol resin is preferable to an epoxy resin because the phenol resin is halogen-free and inexpensive, but the epoxy resin may be used.

The specific resistance of the resistance layer 20 may be appropriately determined depending on the characteristics and the like of the piezoelectric element, but is preferably about $10^3$-$10^6$ $\Omega$m in the present embodiment. The electrical resistance of the resistance layer 20 may be adjusted by changing the type of material, combining a plurality of materials, or changing the dimensions such as the shape and thickness of the resistance layer 20. Thus, in the present embodiment, the electrical resistance of the resistance layer can be easily adjusted according to a desired value. In the present embodiment, the thickness of the resistance layer 20 is not limited, but is preferably 5-20 $\mu$m, for example.

The resistance layer 20 directly covers the ends of the internal electrodes 3 and 4 in the Y-axis direction on the third side surface 10c and connects them, but the resistance layer 20 has a sufficiently high electrical resistance as compared with the internal electrodes 3 and 4, so that there is no possibility that a short circuit occurs between the internal electrodes 3 and 4 having different polarities. Preferably, the resistance layer 20 has a specific resistance higher than that of the internal electrodes 3 and 4 by $10^2$ $\Omega$m or more and lower than that of the insulating layer 30 by $10^2$ $\Omega$m or more.

In the present embodiment, as shown in FIG. 1 and FIG. 2A, the other ends of the internal electrodes 3 and 4 in the Y-axis direction are exposed on a fourth side surface 10d opposite to the third side surface 10c of the element body 10 in the Y-axis. The exposed ends of the internal electrodes 3 and 4 in the Y-axis direction are covered with an insulating layer 40 on the fourth side surface 10d of the element body 10. The insulating layer 40 prevents migration.

Since migration is more likely to occur as the distance between the internal electrodes 3 and 4 having different polarities is smaller, migration can be prevented by covering the fourth side surface 10d with the insulating layer 40 so as to prevent moisture from entering the exposed portion of the internal electrodes.

In the present embodiment, preferably, the insulating layer 40 covers the whole of the exposed portion of the first internal electrodes 3 and the second internal electrodes 4 on the surface of the fourth side surface 10d of the element body 10. This makes it possible to more securely prevent migration. The insulating layer 40 may cover the entire fourth side surface including the exposed portion of the internal electrodes. A plurality of insulating layers 40 may be provided. The thickness of the insulating layer 40 is not limited, but is, for example, about 1-20 $\mu$m.

The material of the insulating layer 40 is not limited as long as it has high insulating properties and can prevent the ingress of moisture and prevent migration between the internal electrodes 3 and 4. Specific examples of the material include resin and glass, but the material is preferably made of epoxy resin, melamine resin, diamond-like carbon (DLC), or the like. The specific resistance of the insulating layer 40 is not limited as long as the insulating properties can be ensured, but is preferably $10^9$ $\Omega$m or more in the present embodiment.

The insulating layer 30 located opposite to the insulating layer 40 in the Y-axis direction is preferably made of an insulating material constituting the insulating layer 40, but is not necessarily made of the same material. The thickness of the insulating layer 30 is about the same as the thickness of the insulating layer 40, but the insulating layer 30 may be thicker or thinner than the insulating layer 40.

As shown in FIG. 1, a first lead wire 50 is connected to the upper part of the first external electrode 5 in the Z-axis direction, and a second lead wire 52 is connected to the upper part of the second external electrode 6 in the Z-axis direction. The first lead wire 50 and the second lead wire 52 are pulled out in a direction away from the third side surface 10c (toward the fourth side surface 10d). Preferably, the insulating layer 40 formed on the fourth side surface 10d does not include an extension part covering a part of the first external electrode 5 and the second external electrode 6. This improves the reliability of the connection of the lead wires 50 and 52 to the external electrodes 5 and 6.

Next, a method of manufacturing the laminated piezoelectric element 1 according to the present embodiment is described. The method of manufacturing the laminated piezoelectric element 1 is not limited, but a sheet method is used in the following description.

First, green sheets with an internal electrode paste film having a predetermined pattern to be the first internal electrodes 3 and the second internal electrodes 4 after firing and green sheets with no internal electrode paste film are prepared.

The green sheets contain the material constituting the piezoelectric layers 2 described above. This material may contain unavoidable impurities. Then, using this material, the green sheets are manufactured by a known technique. Specifically, for example, first, raw materials of the materials constituting the piezoelectric layers are uniformly mixed by means such as wet mixing and then dried. Next, calcination is performed under appropriately determined calcination conditions, and the calcined powder is pulverized in wet manner. Then, a binder is added to the pulverized calcined powder to form a slurry. Next, the slurry is turned into sheets by means such as a doctor blade method and a screen printing method and then dried to obtain green sheets.

Next, an internal electrode paste containing the above-mentioned conductive material is applied onto the green sheets by means such as a printing method to obtain green sheets on which an internal electrode paste film having a predetermined pattern is formed.

Next, these green sheets are overlapped, applied with pressure to be joined, subjected to necessary steps such as a drying step, and thereafter cut to obtain an aggregate of green element bodies.

Next, the aggregate is fired under predetermined conditions to obtain a sintered body of the aggregate, and the sintered body is thereafter cut into strips using a dicing saw or the like. Electrodes to be the first external electrode 5 and the second external electrode 6 are formed on the obtained strip-shaped sintered bodies, and a DC voltage is applied to these electrodes to perform a polarization treatment of the piezoelectric body. Then, the strip-shaped sintered bodies after the polarization treatment are cut into individual element bodies 10 to obtain the element body 10 in which the ends of the internal electrodes 3 or 4 are exposed on the side surfaces. In the present embodiment, the obtained element body 10 is barrel-polished, and the corners and ridges of the element body 10 are subjected to an R surface processing.

Next, the resistance layer 20 is formed on the third side surface 10c of the element body 10. At this time, since the corners and ridges of the element body 10 are rounded, for example, if an increased amount of an insulating resin containing the conductive particles is applied to the third side surface 10c of the element body 10, the resin to be the resistance layer 20 partly drips. Thus, the resistance layer 20 having the extension parts 24 covering a part of the first external electrode 5 and the second external electrode 6 is formed on the third side surface 10c. As a result, the resistance layer 20 connects the exposed ends of the internal electrodes 3 and 4 exposed on the third side surface 10c.

After that, the insulating layer 30 is formed on the third side surface 10c of the element body 10 so as to cover the entire surface of the resistance layer 20 including the extension parts 24. The insulating layer 30 may include extension parts covering a part of the surfaces of the first external electrode 5 and the second external electrode 6 located near the third side surface 10c. The insulating layer 30 may include extension parts covering a part of the upper surface and the lower surface of the element body 10 in the Z-axis direction located near the third side surface 10c. The method of forming the insulating layer 30 is not limited, and examples thereof include a method of applying an insulating resin.

At the same time or before or after that, the insulating layer 40 may be formed on the fourth side surface 10d of the element body 10. The insulating layer 40 may be formed similarly the insulating layer 30 or may be formed by a different method. After, or before and after that, the first lead wire 50 and the second lead wire 52 are connected to the external electrodes 5 and 6, respectively. The connection of the lead wires 50 and 52 to the external electrodes 5 and 6 is performed by, for example, soldering, thermocompression bonding, laser welding, or resistance welding, and the connection position is not limited, but the drawing direction is preferably a direction away from the third side surface 10c. The laminated piezoelectric element 1 shown in FIG. 1 is obtained through the above steps.

In the laminated piezoelectric element 1 of the present embodiment, the resistance layer 20 connects the first internal electrodes 3 and the second internal electrodes 4 having different polarities and exposed on the third side surface 10c of the element body 10. The resistance layer 20 has an electrical resistance value higher than that of the internal electrodes 3 and 4 and lower than that of the insulating layer 30. Thus, even if the temperature environment of the laminated piezoelectric element 1 changes to cause polarization in the direction opposite to the direction of electric polarization, the generated charge can be discharged reliably via the resistance layer 20. As a result, the laminated piezoelectric element 1 according to the present embodiment can prevent a decrease in the degree of polarization even when placed in an environment where the temperature changes.

In the laminated piezoelectric element 1 of the present embodiment, since the resistance layer 20 is covered with the insulating layer 30, the resistance layer 20 is not exposed to the outside air, and the electric resistance value of the resistance layer 20 is hard to change. Thus, the laminated piezoelectric element 1 of the present embodiment is excellent in the prevention effect on characteristic deterioration due to the pyroelectric effect. The insulating layers 30 and 40 prevent migration, and the resistance layer 20 prevents a decrease in the degree of polarization, so that it is possible to obtain a highly reliable laminated piezoelectric element 1.

In the present embodiment, the resistance layer 20 includes the extension part 24 covering the surface of the first external electrode 5 or the second external electrode 6. In the laminated piezoelectric element 1 of the present embodiment, the resistance layer 20 connects the internal electrodes 3 and 4 and does not thereby need to connect the external electrodes 5 and 6, but the extension part 24 covering the surface of the external electrode 5 or the second external electrode 6 may be formed at the time of forming the resistance layer 20. At the corners and ridges of the element body 10, the resistance layer 20 may have a thin part, but it is not necessary to connect the external electrodes 5 and 6, and the function of the resistance layer 20 is thereby unlikely to deteriorate.

In the present embodiment, since the insulating layer 30 is formed on the element body 10 so as to also cover the extension parts 24 of the resistance layer 20, the extension parts 24 of the resistance layer 20 can also effectively be protected.

In the present embodiment, since the first lead wire 50 and the second lead wire 52 are pulled out in a direction away from the third side surface 10c, the lead wires 50 and 52 are less likely to contact with the resistance layer 20, and it is possible to reduce short circuit failures or so.

Second Embodiment

Figure 4:
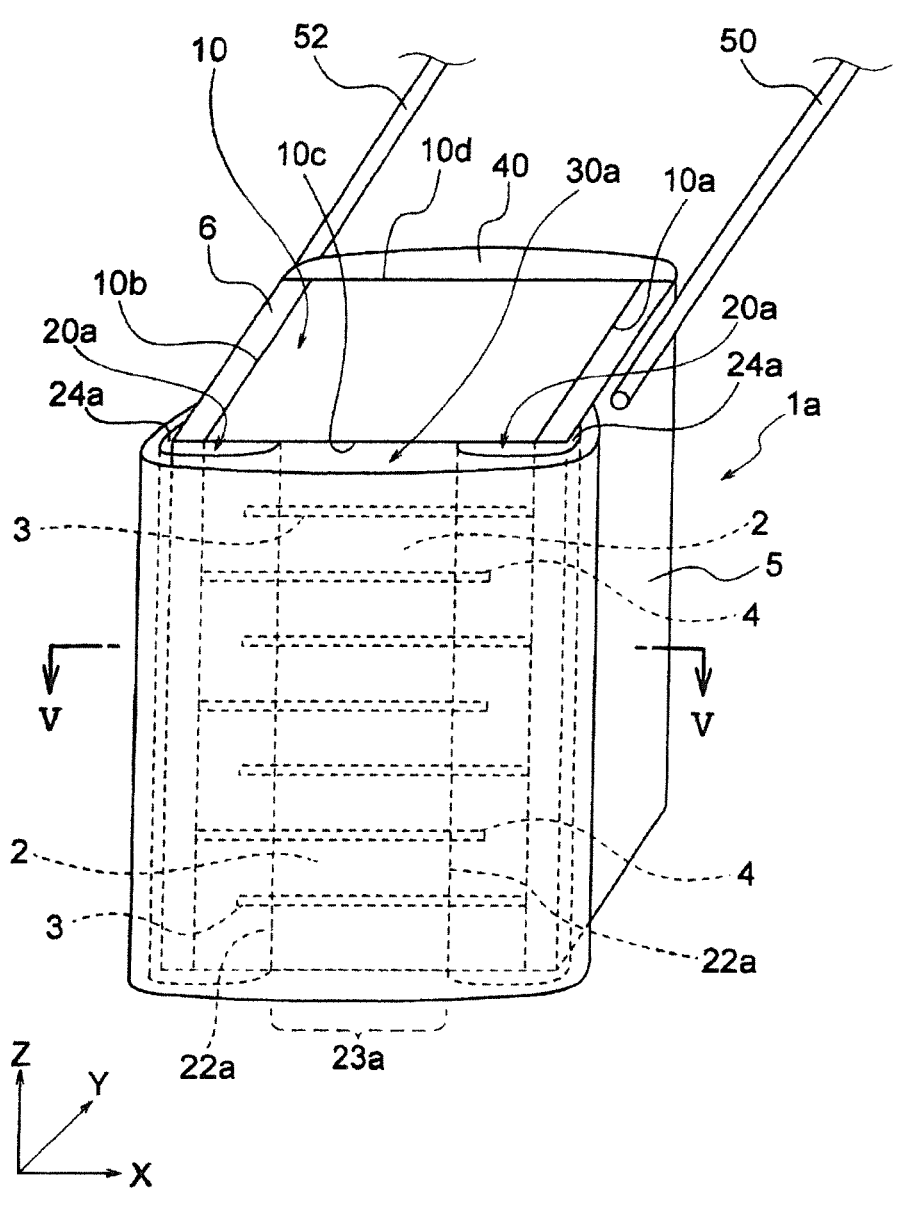
FIG. 4 is a schematic perspective view illustrating a laminated piezoelectric element according to another embodiment of the present invention.
Figure 5:
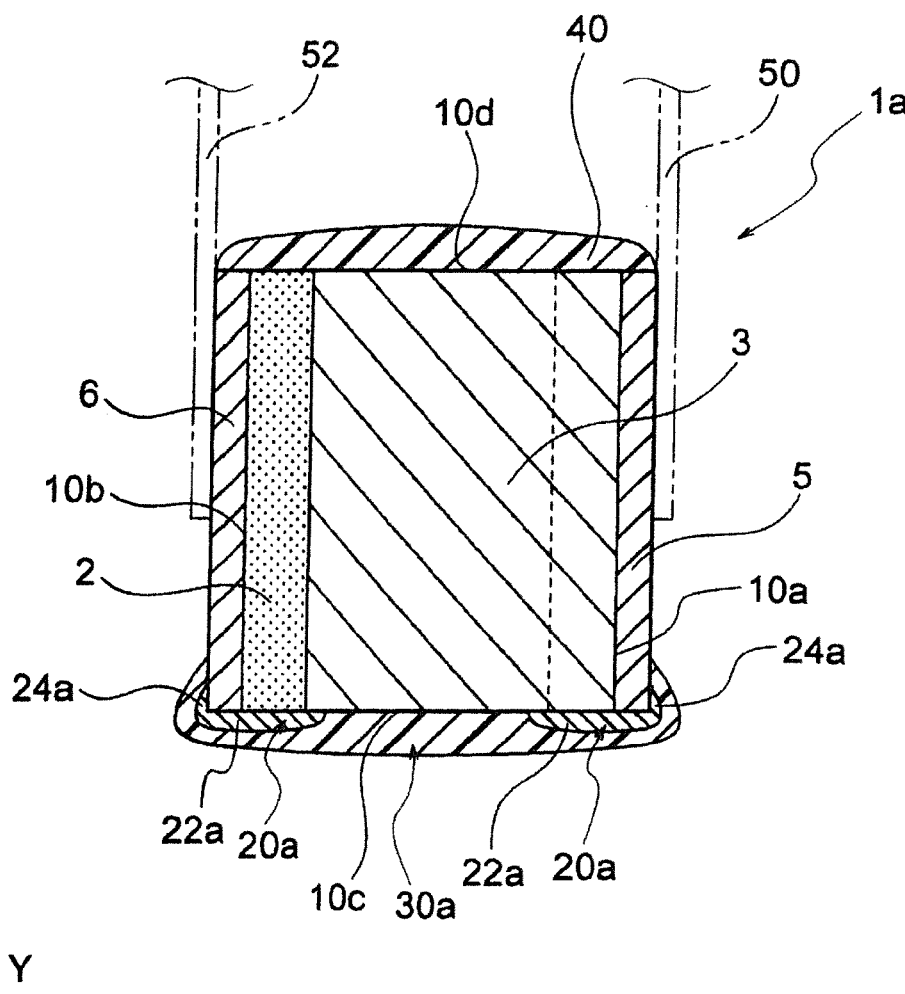
FIG. 5 is a cross-sectional view of a main part of the laminated piezoelectric element along the line V-V shown in FIG. 4.
Figure 5:
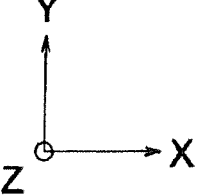

As shown in FIG. 4 and FIG. 5, a laminated piezoelectric element 1a according to the present embodiment is similar to the laminated piezoelectric element 1 of First Embodiment described above except for the following matters. The common members are designated by common reference numerals, and the common parts are not described.

In the present embodiment, unlike First Embodiment, the resistance layer is not formed so as to cover the entire surface of the third side surface 10c of the element body 10, but a resistance layer 20a covering only both sides of the third side surface 10c in the X-axis direction is formed. In the present embodiment, the resistance layer 20a formed on the third side surface 10c includes a pair of vertically continuous parts 22a and 22a, and extension parts 24a and 24a are formed integrally with the vertically continuous parts 22a and 22a.

One vertically continuous part 22a extends in stripe manner in the Z-axis so as to connect the front ends of the first internal electrodes 3 in the X-axis direction and the rear ends of the second internal electrodes 4 in the X-axis direction exposed on the third side surface 10c in the vicinity of the corner between the third side surface 10c and the first side surface 10a. The other vertically continuous part 22a extends in stripe manner in the Z-axis so as to connect the rear ends of the first internal electrodes 3 in the X-axis direction and the front ends of the second internal electrodes 4 in the X-axis direction exposed on the third side surface 10c in the vicinity of the corner between the third side surface 10c and the second side surface 10b. The vertically continuous parts 22a and 22a cover both sides of the third side surface 10c in the X-axis direction continuously in the entire length of the third side surface 10c in the Z-axis direction.

In the present embodiment, a resistor non-covered part 23a that is not covered with the resistance layer 20a is formed on the third side surface 10c. The resistor non-covered part 23a is formed continuously in the Z-axis at a substantially central part of the third side surface 10c in the X-axis direction between the pair of vertically continuous parts 22a and 22a. Preferably, the width of each of the vertically continuous parts 22a and 22a in the X-axis direction is determined so that the exposed ends of the first internal electrodes 3 and the second internal electrodes 4 exposed on the third side surface 10c can be connected securely via the resistance layer 20a. Specifically, the width of each of the vertically continuous parts 22a and 22a in the X-axis direction is preferably determined within the range of ⅙ to ½ of the width of the element body 10 in the X-axis direction.

Other configurations (material, thickness, etc.) of the resistance layer 20a are similar to those of the resistance layer 20 in First Embodiment. The configuration of the extension parts 24a continuously formed to the vertically continuous parts 22a constituting the resistance layer 20 is similar to that of the extension parts 24 of First Embodiment.

In the present embodiment, the insulating layer 30a covers the whole of the resistance layer 20a and also covers the resistor non-covered part 23a left on the third side surface 10c of the element body 10. That is, in the present embodiment, the first internal electrodes 3 and the second internal electrodes 4 having different polarities and exposed on the third side surface 10c of the element body 10 are partially covered with the resistance layer 20a, and the other part is entirely covered with the insulating layer 30a.

Thus, it is possible to prevent the ingress of moisture from the outside of the element 1a and securely prevent the migration generated between the internal electrodes 3 and 4 having different polarities. Since the area where the insulating layer 30a directly contacts with the ceramic surface of the element body 10 becomes large, the connection reliability of the insulating layer 30a to the element body 10 is improved. At the same time, the connection reliability of the resistance layer 20a to the element body 10 is also improved. The other configurations of the insulating layer 30a of the present embodiment are similar to those of the insulating layer 30 of First Embodiment described above.

In the present embodiment, since the third side surface 10c of the element body 10 includes the resistor non-covered part 23a, the resistance layer 20a does not cover the entire surface of the third side surface 10c, so that the load on the piezoelectric element 1a is small to be able to sufficiently exhibit the piezoelectric characteristics. In addition, since the resistor non-covered part 23a is provided on the third side surface 10c of the element body 10, the covering area of the resistor layer 20a can be reduced, and this contributes to cost reduction.

Third Embodiment

Figure 6:
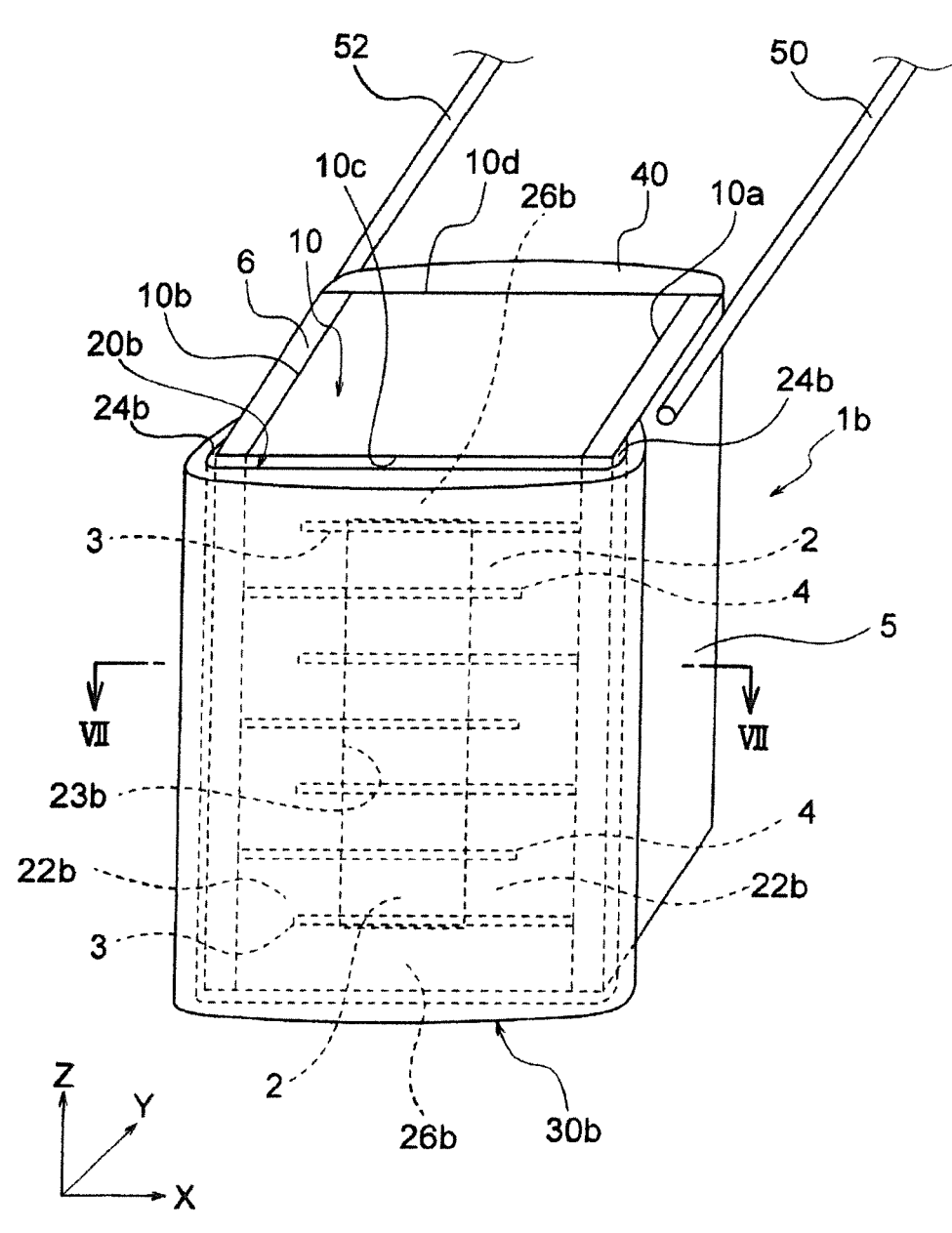
FIG. 6 is a schematic perspective view illustrating a laminated piezoelectric element according to further another embodiment of the present invention.
Figure 7:
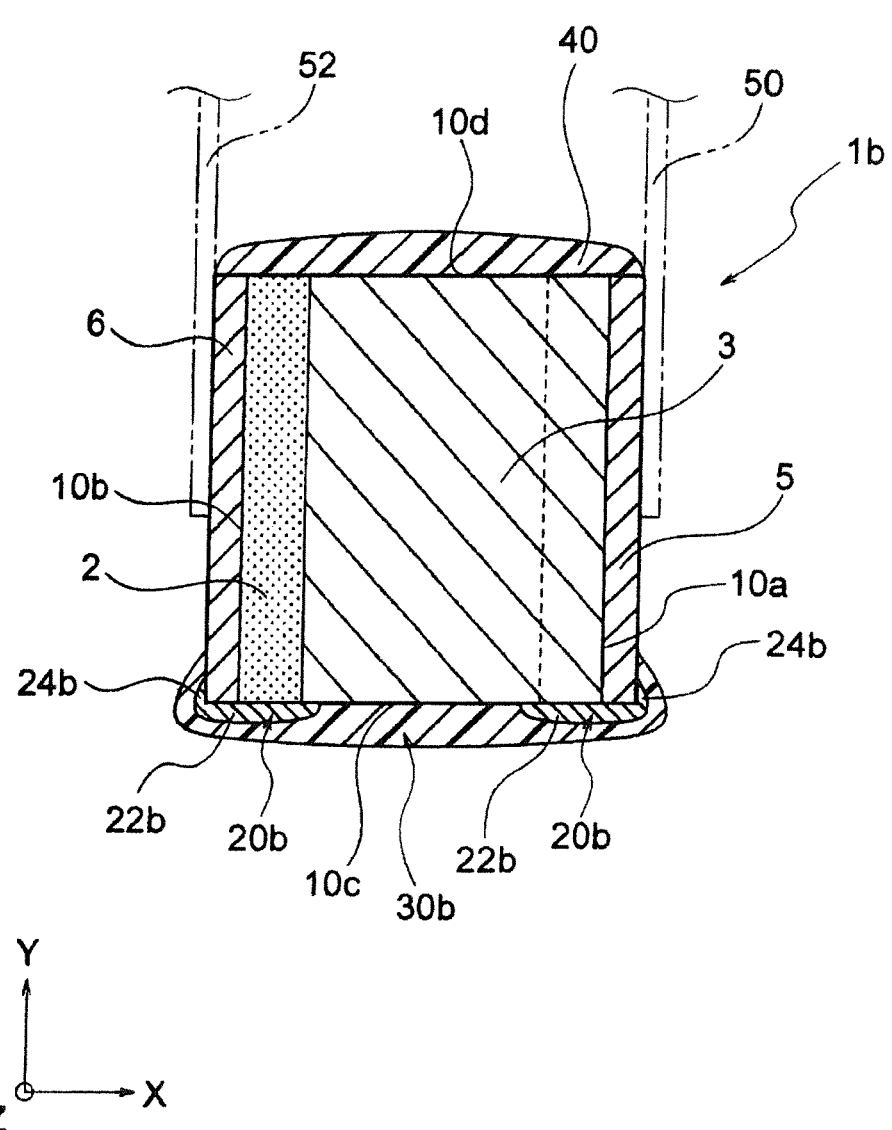
FIG. 7 is a cross-sectional view of a main part of the laminated piezoelectric element along the line VII-VII shown in FIG. 6.

As shown in FIG. 6 and FIG. 7, a laminated piezoelectric element 1b according to the present embodiment is similar to the laminated piezoelectric element 1a of Second Embodiment described above except for the following matters. The common members are designated by common reference numerals, and the common parts are not described.

In the present embodiment, a resistance layer 20b consists of at least a pair of vertically continuous parts 22b and at least one horizontally continuous part 26b. An extension part 24b may be formed in each of the vertically continuous parts 22b.

In the present embodiment, unlike Second Embodiment, the striped vertically continuous parts 22b formed on both sides of the third side surface 10c of the element body 10 in the X-axis direction are connected integrally by at least one horizontally continuous part 26b. In the present embodiment, the pair of vertically continuous parts 22b is connected by the horizontally continuous parts 26b at both ends in the Z-axis direction. A single opening of the resistance layer 20b surrounded by the pair of vertically continuous parts 22b and the pair of horizontally continuous parts 26b is the resistor non-covered part 23b on the third side surface 10c.

In FIG. 6, a single resistor non-covered part 23b is formed on the third side surface 10c, but a plurality of separated resistor non-covered parts 23b may be formed by forming three or more horizontally continuous parts 26b on the third side surface 10c.

In the present embodiment, the insulating layer 30b covers the whole of the resistance layer 20b and also covers the resistor non-covered part 23b left on the third side surface 10c of the element body 10. That is, in the present embodiment, the first internal electrodes 3 and the second internal electrodes 4 having different polarities and exposed on the third side surface 10c of the element body 10 are partially covered with the resistance layer 20b, and the other part is entirely covered with the insulating layer 30b.

Thus, it is possible to prevent the ingress of moisture from the outside of the element 1b and securely prevent the migration generated between the internal electrodes 3 and 4 having different polarities. Since the area where the insulating layer 30a directly contacts with the ceramic surface of the element body 10 becomes large, the connection reliability of the insulating layer 30a to the element body 10 is improved. At the same time, the connection reliability of the resistance layer 20a to the element body 10 is also improved.

The resistance layer 20b and the insulating layer 30b of the present embodiment correspond to the resistance layer 20a and the insulating layer 30a of Second Embodiment, and common parts are not described.

Fourth Embodiment

Figure 8:
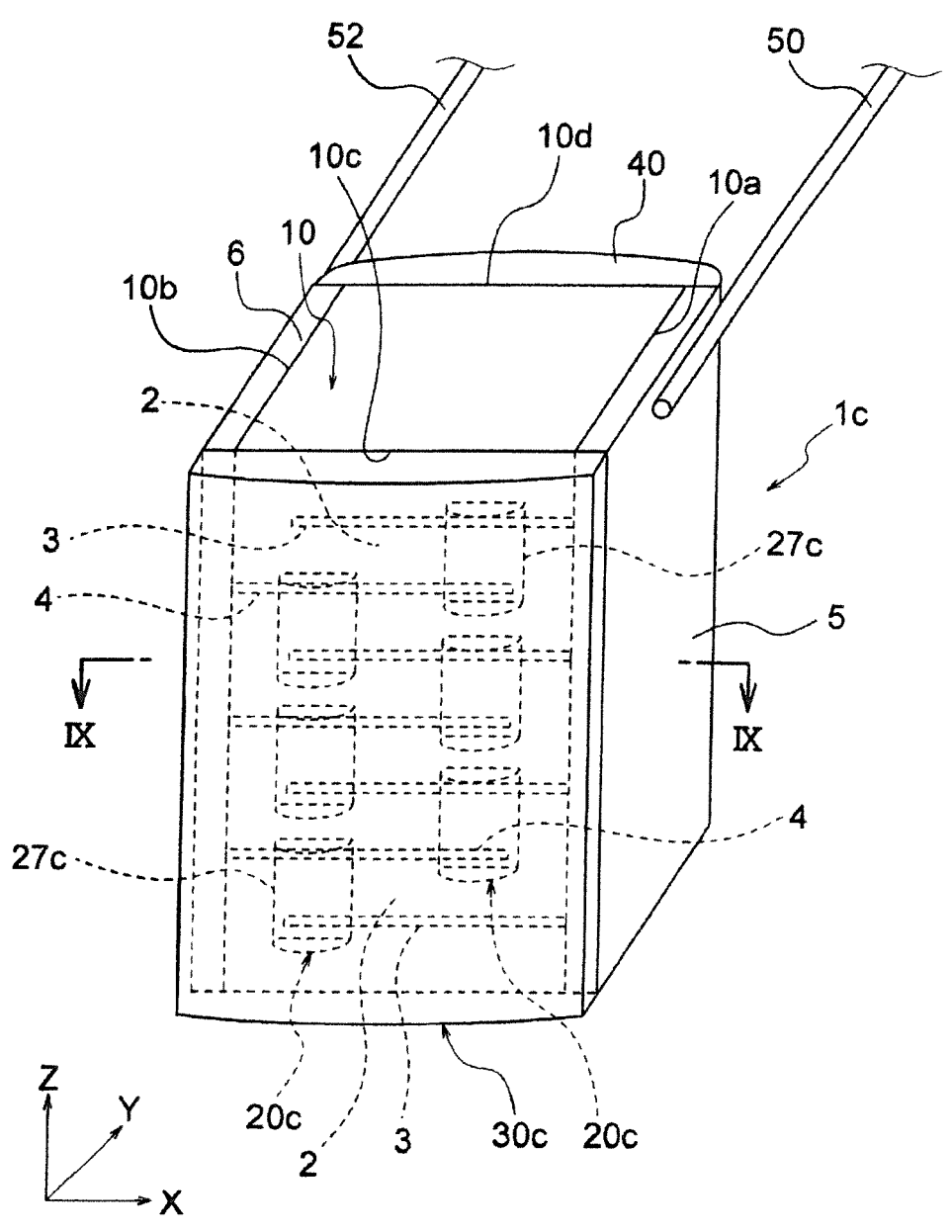
FIG. 8 is a schematic perspective view illustrating a laminated piezoelectric element according to further another embodiment of the present invention.
Figure 9:
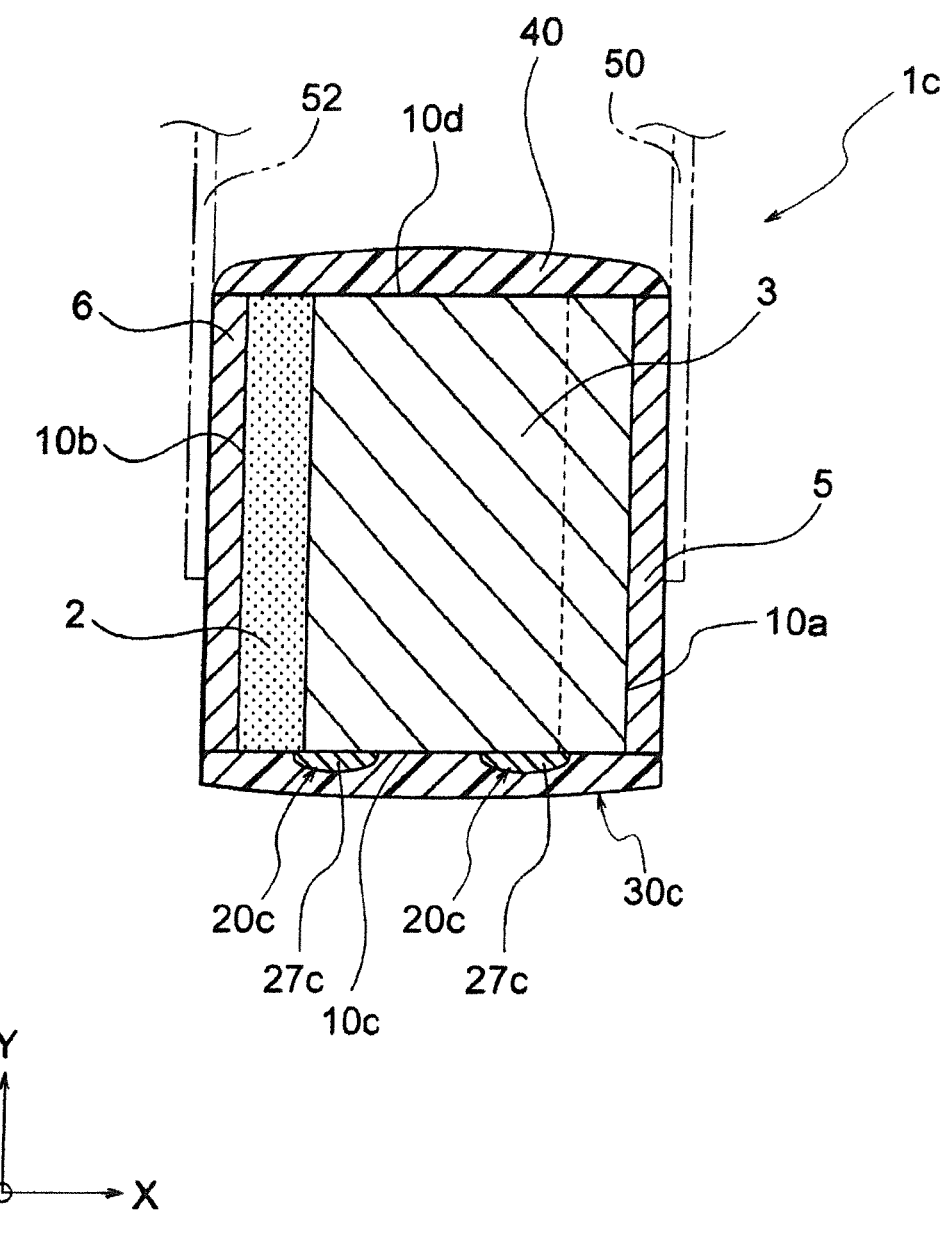
FIG. 9 is a cross-sectional view of a main part of the laminated piezoelectric element along the line IX-IX shown in FIG. 8.

As shown in FIG. 8 and FIG. 9, a laminated piezoelectric element 1c according to the present embodiment is similar to the laminated piezoelectric elements 1, 1a, and 1b of First to Third Embodiments described above except for the following matters. The common members are designated by common reference numerals, and the common parts are not described.

In the present embodiment, a resistance layer 20c is made of a plurality of island parts 27c formed intermittently in the Z-axis direction on the third side surface 10c of the element body 10. Each of the island parts 27c connects the first internal electrode 3 and the second internal electrode 4 via the resistance layer 20c near the front end of the first internal electrode 3 or near the front end of the second internal electrode 4 exposed on the third side surface 10c.

In the present embodiment, the extension parts 24, 24a, and 24b of the above-described embodiments are not preferably formed on the resistance layer 20c, but may be formed thereon. In the present embodiment, the plurality of island parts 27c constituting the resistance layer 20c is formed intermittently in the Z-axis direction in two rows (may be one row or three rows or more) in the X-axis direction, but may be formed continuously in the Z-axis direction.

In the present embodiment, an insulating layer 30c covers the whole of the resistance layer 20c and also covers the resistor non-covered part left on the third side surface 10c of the element body 10. That is, in the present embodiment, the first internal electrodes 3 and the second internal electrodes 4 having different polarities and exposed on the third side surface 10c of the element body 10 are partially covered with the resistance layer 20c, and the other part is entirely covered with the insulating layer 30c.

Thus, it is possible to prevent the ingress of moisture from the outside of the element 1c and securely prevent the migration generated between the internal electrodes 3 and 4 having different polarities. Since the area where the insulating layer 30a directly contacts with the ceramic surface of the element body 10 becomes large, the connection reliability of the insulating layer 30a to the element body 10 is improved. At the same time, the connection reliability of the resistance layer 20a to the element body 10 is also improved.

In the present embodiment, since the resistance layer 20c includes the island parts 27c formed intermittently in the Z-axis direction on the third side surface 10c, the load on the piezoelectric element 1c is small to be able to sufficiently exhibit the piezoelectric characteristics. In addition, since the area of the resistor non-covered part formed on the third side surface 10c of the element body 10 is larger than the total area of the resistance layer 20c, most of the third side surface 10c is directly covered with the insulating layer 30c, and the migration prevention effect is increased. In addition, since the application amount of the resistance layer 20c can be minimized, cost is reduced.

In the present embodiment, since the resistance layer 20c does not cover the surface of the first external electrode 5 or the second external electrode 6, the insulating layer 30c does not need to cover the surface of the first external electrode 5 or the second external electrode 6, either, but extension parts may be provided on both sides of the insulating layer 30c in the X-axis direction so as to cover a part of these surfaces.

The resistance layer 20c and the insulating layer 30c of the present embodiment correspond to the resistance layer 20, 20a, or 20b and the insulating layer 30, 30a, or 30b of First to Third Embodiments, respectively, and common parts are not described.

Fifth Embodiment

Figure 10:
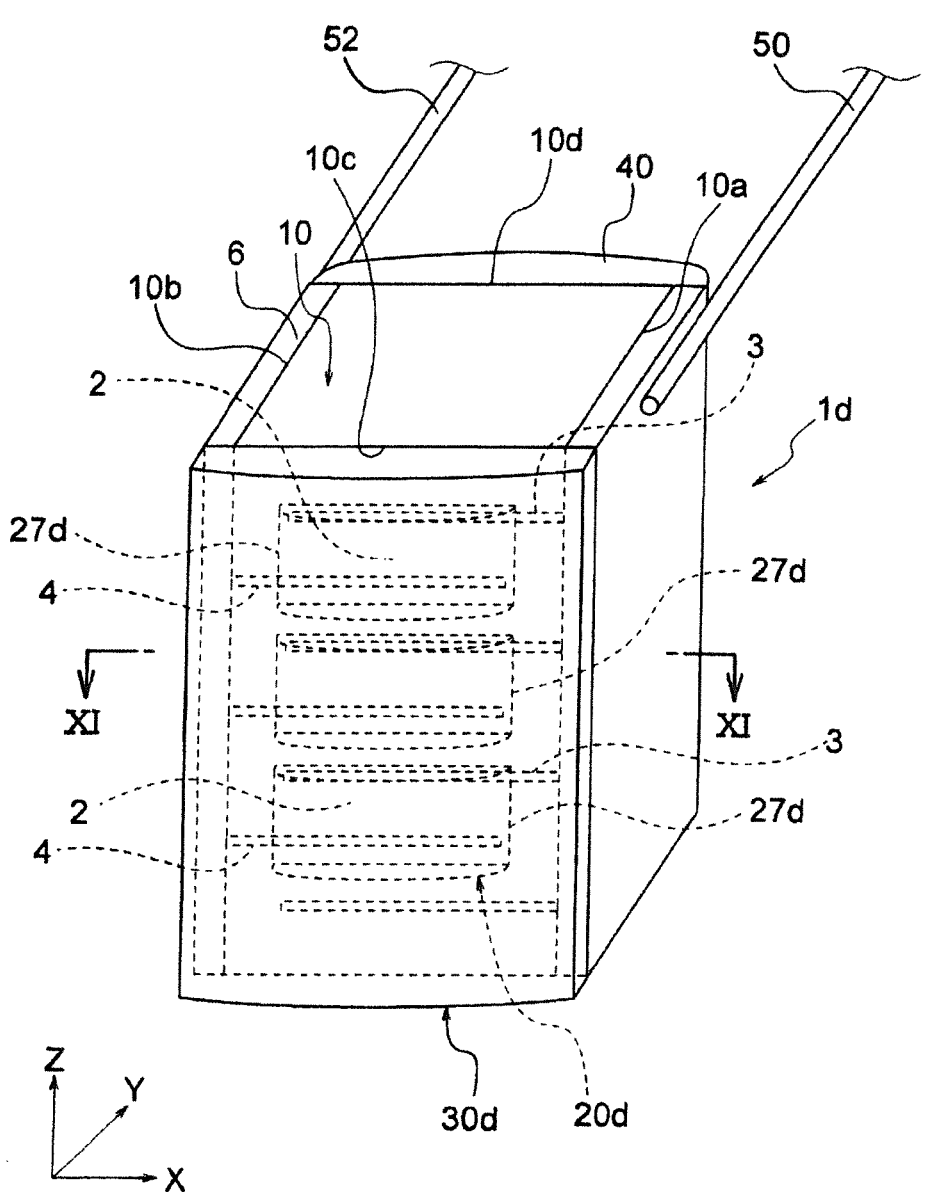
FIG. 10 is a schematic perspective view illustrating a laminated piezoelectric element according to further another embodiment of the present invention.
Figure 11:
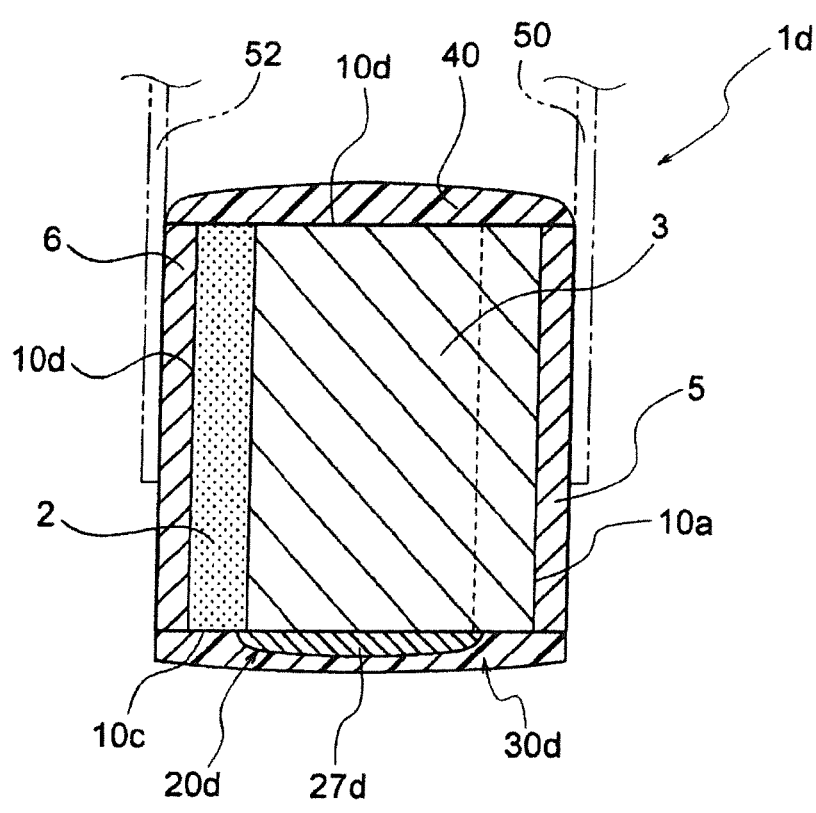
FIG. 11 is a cross-sectional view of a main part of the laminated piezoelectric element along the line XI-XI shown in FIG. 10.
Figure 11:
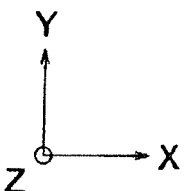

As shown in FIG. 10 and FIG. 11, a laminated piezoelectric element 1d according to the present embodiment is similar to the laminated piezoelectric element 1c of Fourth Embodiment described above except for the following matters. The common members are designated by common reference numerals, and the common parts are not described.

In the present embodiment, a resistance layer 20d is made of a plurality of island parts 27d formed intermittently in the Z-axis direction on the third side surface 10c of the element body 10. At a substantially central part of the third side surface 10c in the X-axis direction, each of the island parts 27d connects the first internal electrode 3 and the second internal electrode 4 exposed from the surface via the resistance layer 20d.

In the present embodiment, the extension parts 24, 24a, and 24b of the above-described embodiments are not preferably formed on the resistance layer 20d, but may be formed thereon. In the present embodiment, the plurality of island parts 27d constituting the resistance layer 20d is formed intermittently in the Z-axis direction in a row in the X-axis direction, but may be formed continuously in the Z-axis direction. The island parts 27d of the present embodiment are formed more widely in the X-axis direction than the island parts 27c of Fourth Embodiment.

In the present embodiment, the insulating layer 30d covers the whole of the resistance layer 20d and also covers the resistor non-covered part left on the third side surface 10c of the element body 10. That is, in the present embodiment, the first internal electrodes 3 and the second internal electrodes 4 having different polarities and exposed on the third side surface 10c of the element body 10 are partially covered with the resistance layer 20d, and the other part is entirely covered with the insulating layer 30d. Thus, it is possible to prevent the ingress of moisture from the outside of the element 1d and securely prevent the migration generated between the internal electrodes 3 and 4 having different polarities.

In the present embodiment, since the third side surface 10c of the element body 10 includes the resistor non-covered part, the resistance layer 20d does not cover the entire surface of the third side surface 10c, so that the load on the piezoelectric element 1d is small to be able to sufficiently exhibit the piezoelectric characteristics. In addition, since the resistor non-covered part is provided on the third side surface 10c of the element body 10, the covering area of the resistor layer 20d can be reduced, this contributes to cost reduction.

In the present embodiment, since the resistance layer 20d does not cover the surface of the first external electrode 5 or the second external electrode 6, the insulating layer 30d does not need to cover the surface of the first external electrode 5 or the second external electrode 6, either, but extension parts may be provided on both sides of the insulating layer 30d in the X-axis direction so as to cover a part of these surfaces.

The resistance layer 20d and the insulating layer 30d of the present embodiment correspond to the resistance layer 20c and the insulating layer 30c of Fourth Embodiment, respectively, and common parts are not described.

Sixth Embodiment

Figure 12:
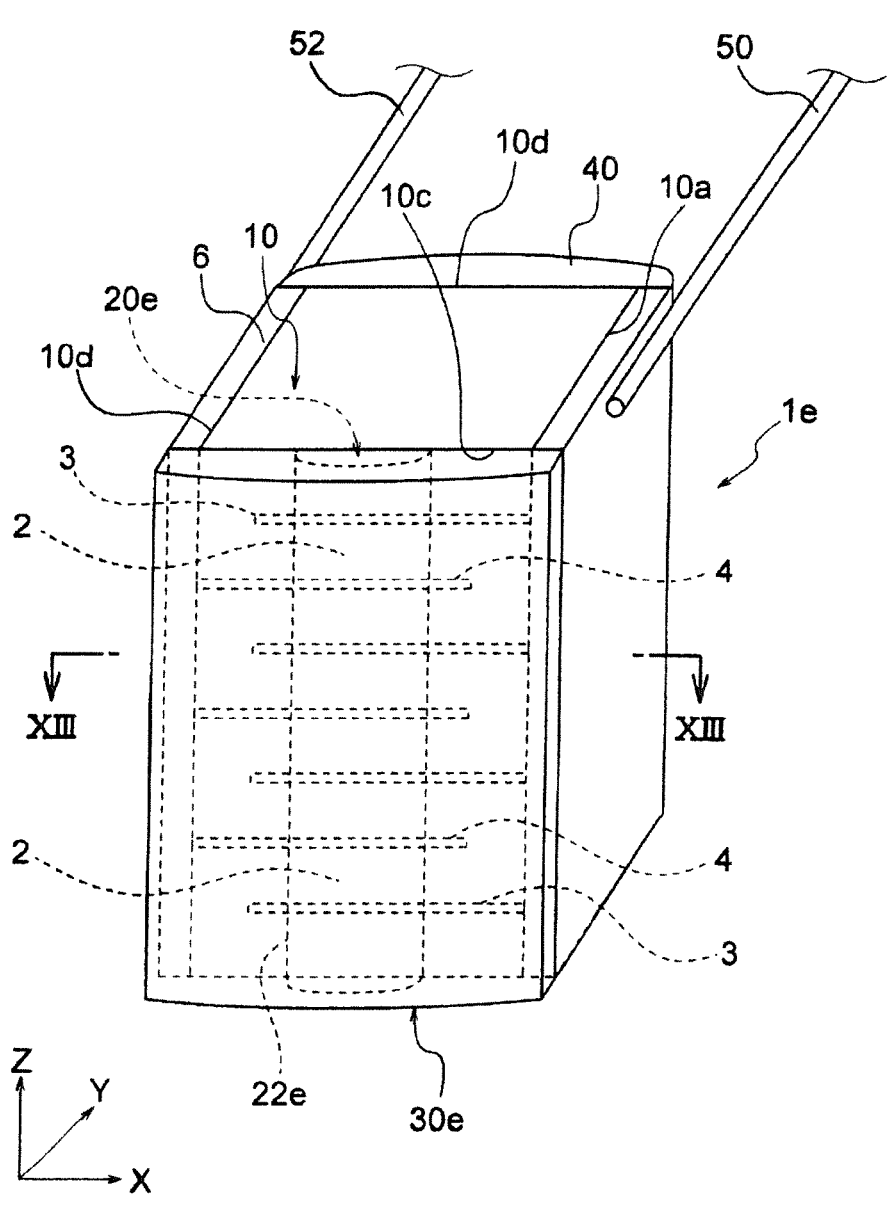
FIG. 12 is a schematic perspective view illustrating a laminated piezoelectric element according to further another embodiment of the present invention.
Figure 13:
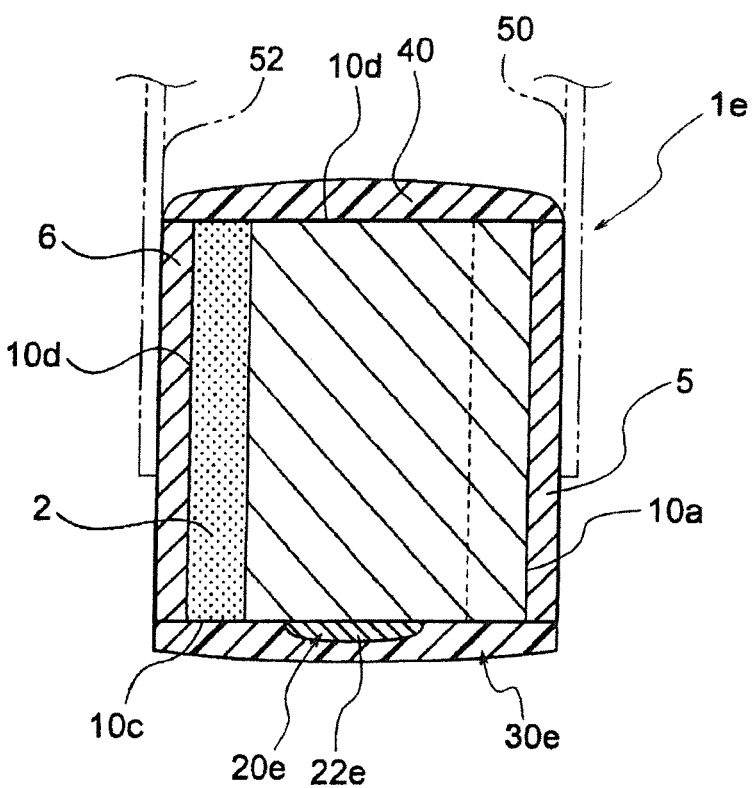
FIG. 13 is a cross-sectional view of a main part of the laminated piezoelectric element along the line XIII-XIII shown in FIG. 12.
Figure 13:
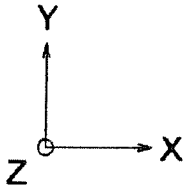

As shown in FIG. 12 and FIG. 13, a laminated piezoelectric element 1e according to the present embodiment is similar to the laminated piezoelectric element 1d of Fifth Embodiment described above except for the following matters. The common members are designated by common reference numerals, and the common parts are not described.

In the present embodiment, a resistance layer 20e is made of a vertically continuous part 22e formed continuously in the Z-axis direction on the third side surface 10c of the element body 10. At a substantially central part of the third side surface 10c in the X-axis direction, the vertically continuous part 22e connects the first internal electrodes 3 and the second internal electrodes 4 exposed from the surface via the resistance layer 20e.

In the present embodiment, the extension parts 24, 24a, and 24b of the above-described embodiments are not formed on the resistance layer 20e. In the present embodiment, the vertically continuous part 22e constituting the resistance layer 20e is preferably continuously formed in the Z-axis direction in a row in the X-axis direction, but may be formed intermittently in the Z-axis direction. In the present embodiment, the width of the resistance layer 20e in the X-axis direction is preferably about 1/16 to 4/5 of the width of the element body 10 in the X-axis direction.

In the present embodiment, the insulating layer 30e covers the whole of the resistance layer 20d and also covers the resistor non-covered part left on the third side surface 10c of the element body 10. That is, in the present embodiment, the first internal electrodes 3 and the second internal electrodes 4 having different polarities and exposed on the third side surface 10c of the element body 10 are partially covered with the resistance layer 20e, and the other part is entirely covered with the insulating layer 30e. Thus, it is possible to prevent the ingress of moisture from the outside of the element 1e and securely prevent the migration generated between the internal electrodes 3 and 4 having different polarities.

In the present embodiment, since the third side surface 10c of the element body 10 includes the resistor non-covered part, the resistance layer 20e does not cover the entire surface of the third side surface 10c, so that the load on the piezoelectric element 1e is small to be able to sufficiently exhibit the piezoelectric characteristics. In addition, since the resistor non-covered part is provided on the third side surface 10c of the element body 10, the covering area of the resistor layer 20d can be reduced, and this contributes to cost reduction.

In the present embodiment, since the resistance layer 20e does not cover the surface of the first external electrode 5 or the second external electrode 6, the insulating layer 30e does not need to cover the surface of the first external electrode 5 or the second external electrode 6, either, but extension parts may be provided on both sides of the insulating layer 30e in the X-axis direction so as to cover a part of these surfaces.

In the present embodiment, the vertically continuous part 22e is located near the center of the third side surface 10c in the X-axis width direction. In this configuration, the resistance layer 20e does not need to pass through the corners of the element body 10 and is easily formed with uniform thickness. As a result, the resistance value of the resistance layer 20e tends to be stable, and it is possible to effectively prevent a decrease in the degree of polarization due to the pyroelectric effect.

In the present embodiment, the area of the resistor non-covered part formed on the third side surface 10c of the element body 10 can be larger than the total area of the resistance layer 20e by reducing the width of the resistance layer 20e in the X-axis direction. In this case, most of the third side surface 10c is directly covered with the insulating layer 30c, and the migration prevention effect is increased. In addition, since the application amount of the resistance layer 20c can be minimized, cost is reduced.

In the present embodiment, the area of the resistor non-covered part formed on the third side surface 10c of the element body 10 can be smaller than the total area of the resistance layer 20e by increasing the width of the resistance layer 20e in the X-axis direction. In this case, the connection reliability between the first internal electrodes 3 and the second internal electrodes 4 via the resistance layer 20e is improved.

The resistance layer 20e and the insulating layer 30e of the present embodiment correspond to the resistance layer 20d and the insulating layer 30d of Fifth Embodiment, respectively, and common parts are not described.

The present invention is not limited to the above-described embodiments and can be modified variously within the scope of the present invention.

For example, the shape of the element body 10 is a quadrangular prism shape in the above-described embodiments, but is not limited. For example, the shape of the element body 10 may be a polygonal pillar shape, a cylindrical shape, or an elliptical pillar shape. In the above-described embodiments, all of the first to fourth side surfaces 10a to 10d have planar shapes, but any of the surfaces may have a convex or concave curved surface shape.

The formation place of the external electrodes is not limited as long as they are electrically connected to the internal electrodes, and the external electrodes may be formed on adjacent surfaces of the element body. A plurality of external electrodes having the same polarity may be formed on the same surface, or a plurality of external electrodes having different polarities may be formed.

EXAMPLES

Hereinafter, the present invention is described based on further detailed examples, but the present invention is not limited to these examples.

Examples 1 and 2

Samples of the laminated piezoelectric element shown in FIG. 1 and FIG. 12 were manufactured. The resistance layers 20 and 20e were made of a phenol resin containing carbon black as conductive particles. The resin constituting the insulating layers 30 and 30e was an epoxy resin and contained no conductive particles.

In all of the samples, the internal electrodes 3 and 4 were made of a metal containing Pd/Ag as a main component, the number of layers thereof was 90, and the external electrodes 5 and 6 were composed of Ag as a main component. The piezoelectric layers 2 were made of a piezoelectric material of $Pb(Zr_xTi_{1-x})O_3$, and the average thickness thereof was 20-22 μm. The average thickness of the internal electrodes 3 and 4 was 2-3 μm.

In the samples, the improvement effect on the polarization deterioration caused by the occurrence of pyroelectric deterioration due to the temperature change was confirmed by lowering the temperature to room temperature after a heat treatment was carried out for one hour in an environment of a temperature of 160° C. Table 1 shows the average value, maximum value, minimum value, and standard deviation value of the piezoelectric k constant of each sample. The standard deviation of the piezoelectric k constant of each sample before and after the heat treatment was evaluated as an index of polarization deterioration.

In the samples before and after the heat treatment, with respect to the design value (50%), a sample having a piezoelectric k constant of 100% to 105% was evaluated as evaluation A, and a sample having a piezoelectric k constant of 95% to 100% was evaluated as evaluation B, a sample having a piezoelectric k constant of 90% to 95% was evaluated as evaluation C, a sample having a piezoelectric k constant of less than 90% was evaluated as evaluation D, and the rate of samples corresponding to each evaluation is shown in Table 1. The evaluations A-D correspond to the characteristic deterioration due to the pyroelectric effect. In the evaluations A-D, the characteristics deteriorate in the order of A to D.

In the samples subjected to the improvement evaluation of polarization deterioration, the natural logarithm of the resistance value before and after heating was calculated, the standard deviations were compared, the improvement effect on the variation in the resistance values caused by the thinning of the corners of the element body was confirmed, and the improvement effect on the fluctuation in the resistance values of the resistance layer caused by exposure to the outside air was confirmed. Table 1 shows the average value, maximum value, minimum value, and standard deviation value of each sample before and after heating. The natural logarithm of the resistance value means that, for example, the natural logarithm was 5 when the resistance value was $1 \times 10^5 \Omega$.

TABLE 1

| | Reference Example 1 | | Example 1 FIG. | | Example 2 | |
| | FIG. 1 of Patent Document 2 | | FIG. 1 Treatment State | | FIG. 12 | |
| | Before Heat Treatment | After Heat Treatment | Before Heat Treatment | After Heat Treatment | Before Heat Treatment | After Heat Treatment |
|---|---|---|---|---|---|---|
| Average Value of Piezoelectric k Constant (%) | 50.5 | 47.9 | 50.5 | 50.6 | 50.6 | 50.5 |
| Maximum Value of Piezoelectric k Constant (%) | 51.9 | 52.6 | 51.1 | 51.4 | 51.4 | 51.6 |
| Minimum Value of Piezoelectric k Constant (%) | 46.5 | 41.9 | 49.7 | 49.8 | 49.8 | 49.7 |
| Standard Deviation of Piezoelectric k Constant | 0.8 | 1.9 | 0.4 | 0.4 | 0.4 | 0.4 |
| Rate of Evaluation A | 77.1% | 3.2% | 93.3% | 91.3% | 95.0% | 91.2% |
| Rate of Evaluation B | 22.8% | 75.5% | 6.7% | 8.7% | 5.0% | 8.8% |
| Rate of Evaluation C | 0.1% | 7.6% | 0.0% | 0.0% | 0.0% | 0.0% |
| Rate of Evaluation D | 0.0% | 13.7% | 0.0% | 0.0% | 0.0% | 0.0% |
| Average Value of Insulating Resistance | 8.5 | 8.2 | 4.6 | 4.9 | 4.8 | 5.1 |
| Maximum Value of Insulating Resistance | 9.0 | 10.0 | 4.9 | 5.3 | 5.1 | 5.5 |
| Minimum Value of Insulating Resistance | 7.8 | 7.5 | 4.0 | 4.8 | 4.3 | 4.8 |
| Standard Deviation of Insulating Resistance | 0.3 | 0.5 | 0.2 | 0.2 | 0.2 | 0.2 |

\* Insulating Resistance is a value taken from the natural logarithm.

Reference Example 1

Table 1 shows the results of preparing the samples shown in FIG. 1 of Japanese Patent No. 5842635 (Patent Document 2) and conducting the test under the same conditions as in Example 1. That is, unlike the samples of Example 1, the samples of Reference Example 1 were prepared by reversing the lamination order of the resistance layer 20 and the insulating layer 30, covering a part of the insulating layer 30 with the resistance layer 20, and connecting both ends of the resistance layer 20 in the X-axis direction to the first external electrode 5 and the second external electrode 6, respectively.
Evaluation It was confirmed from Table 1 that, in the samples of Reference Example 1, the standard deviation of the piezoelectric k constant became large after the heat treatment, and the rate of evaluations B to D increased, so that pyroelectric deterioration due to temperature change was generated. It was also confirmed that, in the samples of Examples 1 and 2, the standard deviation of the piezoelectric k constant did not change after the heat treatment, and the rate of evaluations B to D did not increase as compared with the samples of Reference Example 1, so that the pyroelectric deterioration due to temperature change was prevented.

It was confirmed from Table 1 that the standard deviation of the natural logarithm of the insulating resistance of the samples of Examples 1 and 2 was smaller that of the samples of Reference Example 1, so that a device having a more stable resistance value was manufactured. It was also confirmed from Table 1 that, in the samples of Reference Example 1, since the standard deviation of the insulating resistance after the heat treatment was large, the resistance value of the resistance layer fluctuated due to the exposure of the resistance layer to the outside air. It was also confirmed that, in the samples of Examples 1 and 2, since the standard deviation of the insulating resistance did not fluctuate before and after the heat treatment, it was possible to prevent the fluctuation of the resistance value of the resistance layer caused by the exposure of the resistance layer to the outside air.

EXPLANATION OF REFERENCES 1,1a-1e . . . laminated piezoelectric element
2 . . . piezoelectric layer
2a . . . exterior region
3 . . . first internal electrode
4 . . . second internal electrode
5 . . . first external electrode
6 . . . second external electrode
10 . . . element body
10a . . . first side surface
10b . . . second side surface
10c . . . third side surface
10d . . . fourth side surface
20, 20a-20e . . . resistance layer
22, 22a, 22b, 22e . . . vertically continuous part
23a, 23b . . . resistor non-covered part
24, 24a, 22b . . . extension part
26b . . . horizontally continuous part
27c, 27d . . . island part
30, 30a-30e, 40 . . . insulating layer
50, 52 . . . lead wire

The invention claimed is:
1. A laminated piezoelectric element comprising:
   an element body including a first internal electrode, a piezoelectric layer, and a second internal electrode having a polarity different from that of the first internal electrode laminated in this order along a lamination direction;
   a first external electrode electrically connected to the first internal electrode and formed on a first side surface of the element body;

a second external electrode electrically connected to the second internal electrode and formed on a second side surface of the element body;

a resistance layer formed on at least a part of a third side surface of the element body where the first internal electrode and the second internal electrode are exposed and connects the first internal electrode and the second internal electrode; and an insulating layer formed on the third side surface so as to cover the resistance layer, wherein the first external electrode and the second external electrode are not formed on the third side surface, the resistance layer covers at least a part of the third side surface and is laminated on the third side surface in a direction perpendicular to the third side surface, and at least a part of the insulating layer is laminated on the resistance layer in the direction perpendicular to the third side surface.

2. The laminated piezoelectric element according to claim 1, wherein a resistor non-covered part where the first internal electrode or the second internal electrode is exposed without forming the resistance layer remains on the third side surface of the element body, and the insulating layer covers the resistance layer and also covers the resistor non-covered part.

3. The laminated piezoelectric element according to claim 1, wherein the resistance layer includes a vertically continuous part formed continuously along the lamination direction on the third side surface of the element body.

4. The laminated piezoelectric element according to claim 1, wherein the resistance layer includes an island part formed intermittently along the lamination direction on the third side surface of the element body.

5. The laminated piezoelectric element according to claim 1, wherein the resistance layer includes an extension part covering a surface of the first external electrode or the second external electrode.

6. The laminated piezoelectric element according to claim 5, wherein the insulating layer is formed on the element body so as to also cover the extension part.

7. The laminated piezoelectric element according to claim 1, wherein a first lead wire is connected to the first external electrode, a second lead wire is connected to the second external electrode, and the first lead wire and the second lead wire are pulled out in a direction away from the third side surface.

8. The laminated piezoelectric element according to claim 1, wherein the resistance layer overlaps with at least a portion of the first internal electrode, the second electrode, or the piezoelectric layer in the direction perpendicular to the third side face.

9. The laminated piezoelectric element according to claim 1, wherein at least a part of the insulating layer covers the resistance layer laminated on the third side surface in the direction perpendicular to the third side surface.

10. The laminated piezoelectric element according to claim 8, wherein the insulating layer covers the resistance layer laminated on the third side surface without entirely covering the first side surface and the second side surface.

11. The laminated piezoelectric element according to claim 1, wherein the insulating layer entirely covers the third side surface.

* * * * *